(12) United States Patent
Miller, Jr.

(10) Patent No.: US 7,196,558 B2
(45) Date of Patent: Mar. 27, 2007

(54) FREQUENCY DIVIDER WITH SLIP

(75) Inventor: Robert H Miller, Jr., Loveland, CO (US)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 41 days.

(21) Appl. No.: 11/076,758

(22) Filed: Mar. 10, 2005

(65) Prior Publication Data

US 2006/0202725 A1    Sep. 14, 2006

(51) Int. Cl.
*H03K 21/00*    (2006.01)
(52) U.S. Cl. .................................. 327/115; 327/117
(58) Field of Classification Search .................... None
See application file for complete search history.

(56) References Cited

U.S. PATENT DOCUMENTS

| | | | | |
|---|---|---|---|---|
| 5,195,111 A * | 3/1993 | Adachi et al. | ................. | 377/52 |
| 6,108,393 A * | 8/2000 | Opsahl | ......................... | 377/47 |
| 6,236,278 B1 * | 5/2001 | Olgaard | ....................... | 331/25 |
| 6,369,623 B1 * | 4/2002 | Heinen | ......................... | 327/117 |
| 6,617,893 B1 * | 9/2003 | Born et al. | .................. | 327/115 |

\* cited by examiner

*Primary Examiner*—Timothy P. Callahan
*Assistant Examiner*—Cassandra Cox

(57) ABSTRACT

An apparatus has a frequency divider accepting a clock. The frequency divider is selectable between an N divide factor and an M divide factor via a divide mode signal, where an absolute value of (N−M)=1. The apparatus also has a pulse generator responsive to a slip signal and driven by an output of the frequency divider and providing the divide mode signal to the frequency divider.

21 Claims, 7 Drawing Sheets

FREQUENCY DIVIDER WITH SLIP

BACKGROUND

Certain circuits use different clocks where the frequency of one clock is an integer multiple of a frequency of another clock. In these cases, it is common to provide a clock and a frequency divider circuit that divides the clock by some multiple. An output of the frequency divider may then be used as the second clock in the circuit. In some contexts, it is desirable for the clocks to be synchronized to each other. Specifically, it is desirable that an edge of the lower frequency clock be placed in time relative to a specific edge of the higher frequency clock. Which one of the specific edges destined for synchronization is determined in a circuit that provides a "1" or "0" logic value depending upon whether the two clocks are properly synchronized or not. At power-up, however, the phase difference between the two clocks is not known or predictable. There is a need, therefore, for an apparatus and method to synchronize two clocks relative to each other.

BRIEF DESCRIPTION OF THE DRAWINGS

An understanding of the present teachings can be gained from the following detailed description, taken in conjunction with the accompanying drawings of which.

DETAILED DESCRIPTION

Figure 1:
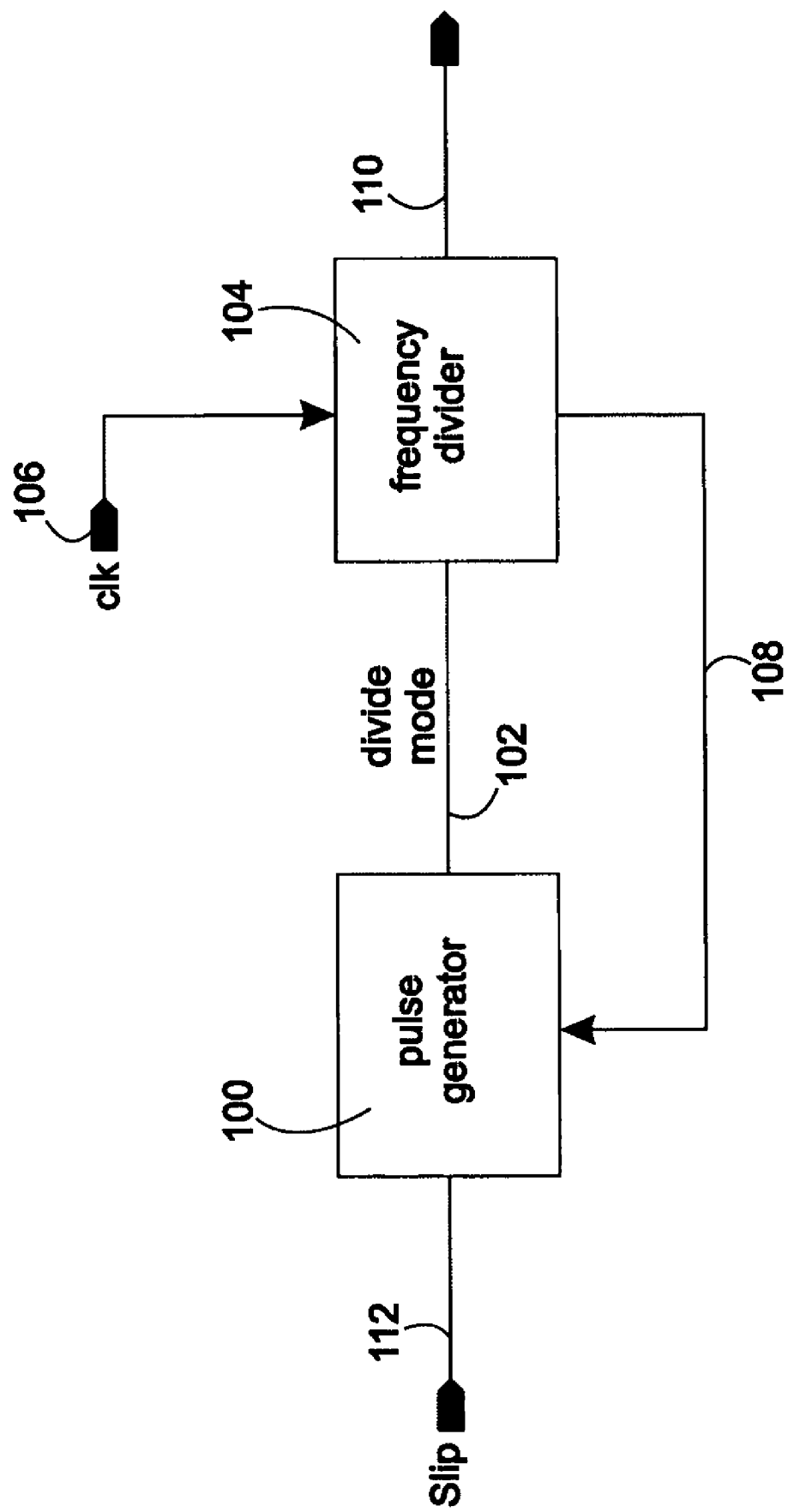
FIG. 1 is block diagram of an embodiment of an apparatus according to the present teachings.

With specific reference to FIG. 1 of the drawings, there is shown a block diagram of an apparatus according to the present teachings in which a pulse generator 100 has a divide mode output 102 that drives a frequency divider 104. The frequency divider 104 is selectable between a divide by N and a divide by M where an absolute value of (N−M)=1. Selection between the N and M divide factors is based upon a logic value of a divide mode 102. The divide mode 102 is normally a logic "high" or "1" value causing the frequency divider 104 to divide by N. When the divide mode is a logic "low" or "0" value, the frequency divider 104 divides by M. A clock signal 106 having a frequency, f, is received by the frequency divider 104. A first frequency divider output signal 108 provides the clock signal for the pulse generator 100. A second frequency divider output signal 110 provides an external output of the frequency divider 104. In some embodiments, the first and second frequency divider output signals 108, 110 may be the same signal. In other embodiments, the first and second frequency divider output signals 108, 110 are phase shifted relative to each other or inverted or both to achieve various phase shift quantities. Both the first and second frequency divider output signals 108, 110 have a frequency of the clock signal 106 divided by N, represented as f/N, or a frequency of the clock signal 106 divided by M, represented as f/M, depending upon a value of the divide mode 102. A slip signal 112 causes the pulse generator 100 to initiate a low going pulse at its output 102. The slip signal 112, therefore, causes the frequency divider 104 to divide the clock signal 106 by M for one frequency divider cycle. The slip signal 112, therefore, results in a frequency divider output signal 110 that is phase shifted relative to the clock signal 106 at the end of the divide by M frequency cycle. A single transition of the slip signal 112 results in a phase shift of the clock 106 relative to the frequency divider output. 110 by a single cycle of the clock 106. The slip process may be repeated until the frequency divider signal 110 is shifted to the point where is has a desired synchronization with the clock signal 106.

Figure 2:
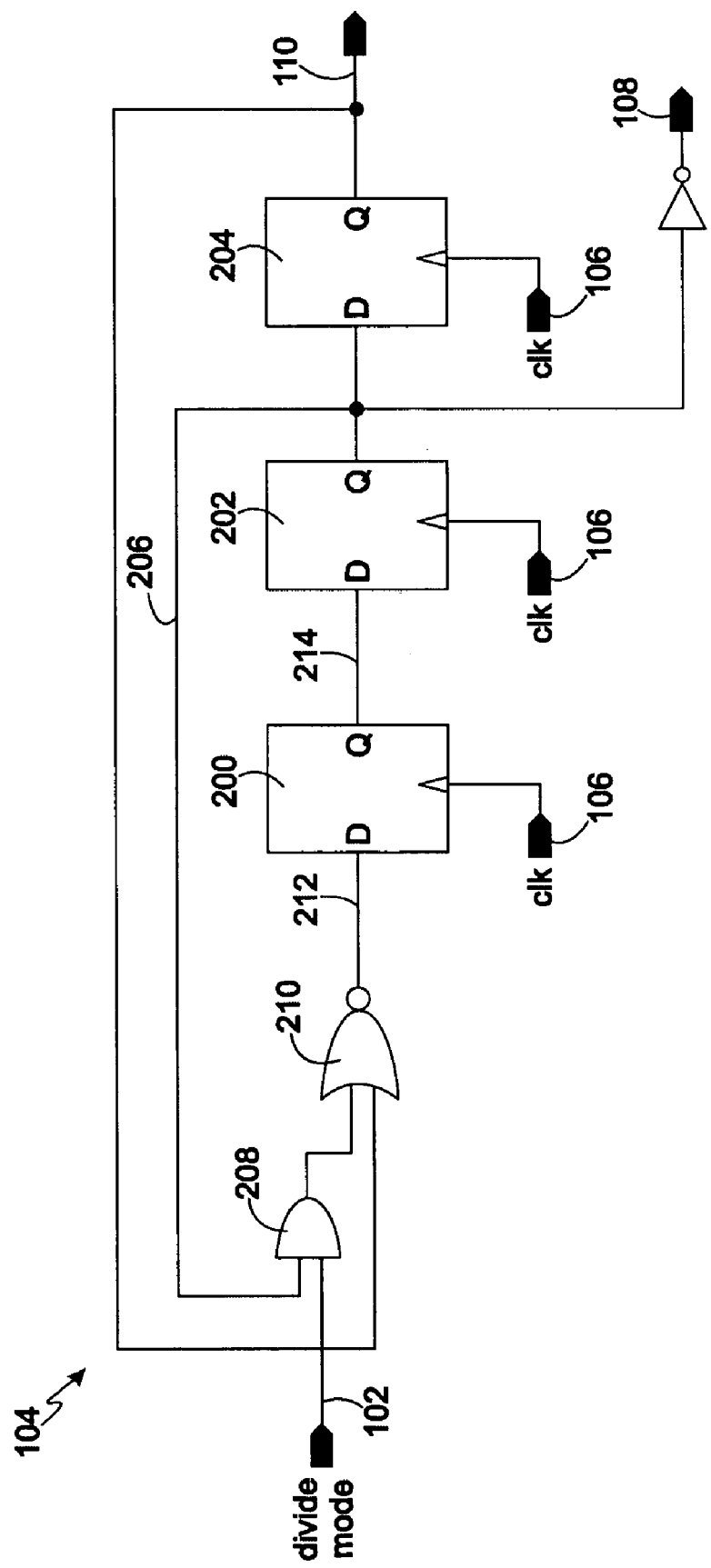
FIG. 2 is a circuit diagram of a frequency divider according to the present teachings.

With specific reference to FIG. 2 of the drawings, there is shown a circuit diagram of an embodiment of a frequency divider 104 according to the present teachings. The embodiment shown is a divide by 5/divide by 6 frequency divider. The present teachings may be adapted to frequency dividers having divide factors other than that specifically disclosed. When the frequency divider illustrated in FIG. 2 is in the divide by 5 frequency divider mode, the frequency divider 104 is self-initializing. "Self-initializing" refers to the quality of the circuit where certain states are predictably repeated over time ("defined states") and all other states ("undefined states") eventually transition to one of the states that predictably repeat over time. Advantageously, a self-initializing frequency divider does not require a reset signal in order to initiate proper operation. Embodiments of self-initializing divide by N frequency dividers that are compatible with the present teachings are disclosed in commonly owned U.S. patent application Ser. No. 11/058,767 filed on Feb. 16, 2005 entitled "Self-Initializing Frequency Divider" by the present inventor, the teachings of which are hereby incorporated by reference and referred to herein as "the Self Initializing Frequency Divider patent application". The frequency divider of FIG. 2 comprises three memory elements, a re-circulating memory element 200, a feedback memory element 202 and an end memory element 204 in series combination. All three memory elements 200, 202, 204 are driven by the clock 106. A feedback memory element output 206 is presented to an AND gate 208 that also receives the divide mode signal 102. An end memory element output 110 feeds back to the re-circulating memory element 200 through NOR gate 210. An output of the NOR gate 210 is presented to a re-circulating memory element input 212.

When the divide mode 102 is a logic "1", the AND gate 208 is functionally removed from the frequency divider circuit 104. Input into the re-circulating memory element 200, therefore, is a function of a disjunctive combination of the end memory element output 110 and the feedback memory element output 206. A state for the frequency divider illustrated in FIG. 2 of the drawings is defined as a re-circulating memory element output 214, the feedback memory element output 206, and the end memory element output 110. The truth table for the frequency divider memory elements outputs 214, 206, 110, therefore is:

TABLE 1

| State # | Logic state |
| --- | --- |
| 1 | 000 |
| 2 | 100 |
| 3 | 110 |
| 4 | 011 |
| 5 | 001 |
| 6 | 000 |
| 7 | 100 |

Table 1 shows a divide by 5 frequency divider state machine. As explained in the Self-Initializing Frequency Divider patent application reference herein, those undefined states for the divide by 5 state machine eventually transition to one of the defined states.

With further reference to FIG. 2 of the drawings, when the divide mode 102 is logic "0", the AND gate 208 causes the divide mode signal 102 to impact the frequency divider circuit 104. The truth table for the memory element outputs 214, 206, 110 for the frequency divider 104 where the divide mode 102 is a logic "0", therefore, is:

TABLE 2

| State # | Logic state |
| --- | --- |
| 1 | 000 |
| 2 | 100 |
| 3 | 110 |
| 4 | 111 |
| 5 | 011 |
| 6 | 001 |
| 7 | 000 |
| 8 | 100 |

As seen by a comparison of Tables 1 and 2, when the divide mode 102 is a logic "1", the frequency divider circuit 104 has five defined states and operates as a divide by 5. When the divide mode 102 is a logic "0", the frequency divider circuit 104 has six defined states and is a divide by 6. Specifically, an extra state where all memory element outputs have a logic "1" value is defined for the circuit when the divide mode is a logic "0" that is undefined for the circuit when the divide mode is a logic "1". The logic "0" divide mode 102 inhibits the feedback from the feedback memory element 202, thereby stretching the time that the feedback memory element output 206 is high to three cycles of the clock 106 instead of two cycles. Using this attribute, when the frequency divider circuit 104 normally operates as a divide by 5, the circuit 104 may be directed to divide by 6 for one frequency divider clock cycle and then revert back to the divide by 5 operation. In so doing, the divide by 5 cycle is phase "slipped" relative to the common clock 106 by a single period of the common clock 106.

Figure 3:
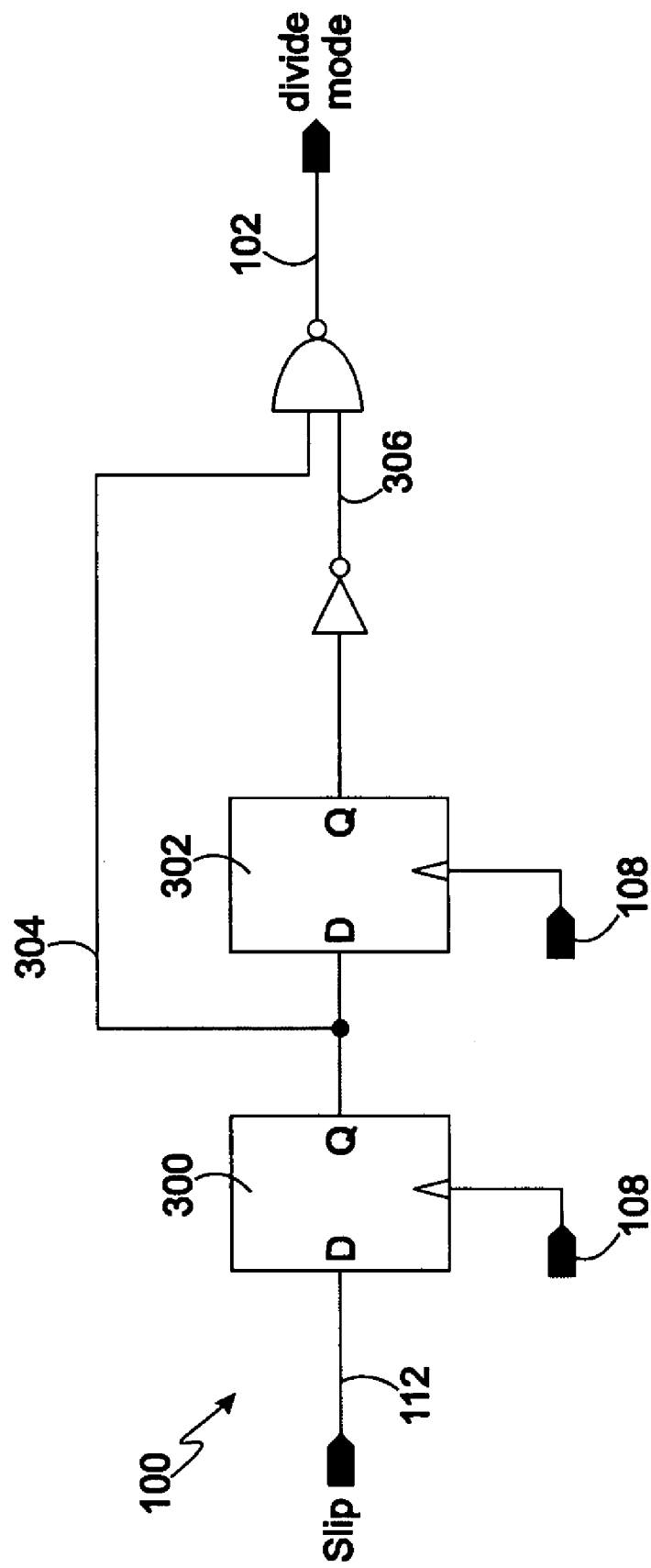
FIG. 3 is a circuit diagram of a pulse generator according to the present teachings.

With specific reference to FIG. 3 of the drawings, there is shown a pulse generator 100 according to the present teachings that accepts a "low" to "high" going transition of the slip signal 112 and presents a "high" to "low" going pulse as the divide mode signal 102. The pulse generator 100 comprises first and second flip flops 300, 302 in series combination. Each one of the first and second flip flops is clocked by the frequency divider output 108. In the embodiment shown in FIGS. 2 & 3, the frequency divider output 108 that is used to clock the pulse generator is an inverse of the feedback memory element output 214. A first flip flop output 304 is conjunctively combined with an inverse of a second flip flop output 306 and then negated, a NAND function, to arrive at a low going pulse that is the divide mode signal 102.

Figure 4:
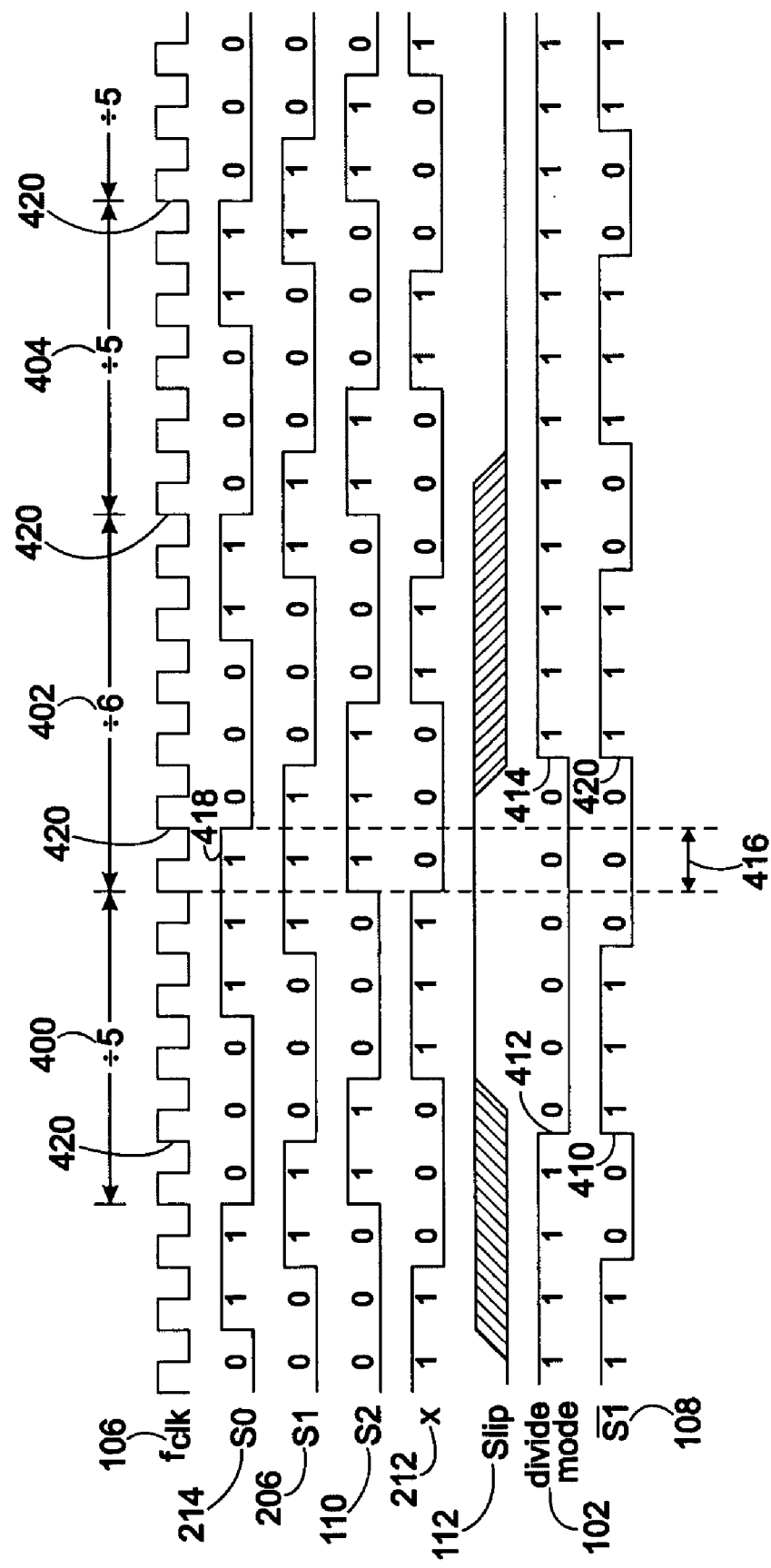
FIG. 4 is a timing diagram of the frequency divider of FIG. 2 responding to a divide mode signal from the pulse generator of FIG. 3.

With specific reference to FIG. 4 of the drawings, there is shown a timing diagram showing a relationship of logic edges relevant in the illustrated embodiment of FIGS. 2 & 3. It is desired to synchronize the end memory element output 110 with a specific every $5^{th}$ edge of the clock, labeled for illustrative purposes as 420. For purposes of present illustration, the end memory element output 110 is considered the frequency divider output signal to clock a circuit (not shown). The external circuit that is not illustrated is unimportant to and outside the scope of the present teachings. Depending upon a specific application of the frequency divider, however, any one of the memory element outputs 214, 206, 110 or their inverse may be used as the frequency divider output. Also for purposes of illustration, a frequency divider output signal cycle is defined by rising edges of the end memory element output 110. As one of ordinary skill in the art appreciates, a cycle may also be defined by falling edges of any one of the memory element outputs 214, 206, 110. Also, for purposes of present illustration, the inverse of the feedback memory element output 108 drives the pulse generator circuit 100.

During a previous divide by 5 frequency divider cycle 400, a slip signal 112 is initiated to slip the phase of the frequency divider output by a single cycle of the clock 106. While the slip signal 112 is high, a logic one is clocked into the first flip flop 300 at a next rising transition of the inverse of the feedback memory element output 108, see 410. A logic one at the output of the first flip flop causes the divide mode signal 102 to transition from it's normally high state to a logic zero, see 412. The divide mode signal 102 stays low until a next rising transition of the inverse of the feedback memory element output 108, see 414. As one of ordinary skill in the art appreciates from review of FIG. 3, the slip signal 112 should transition back to a low state before the next rising transition of the inverse of the feedback memory element output 108, see 414, if another slip cycle is not intended. While the divide mode signal 102 is low, the AND gate 208, and therefore the effect of the feedback memory element output 206, is functionally removed from the frequency divider circuit 104. This causes a logic "1" to be clocked into the re-circulating memory element 200 instead of a logic "0" after the "110" state, see 418. Accordingly, the "111" state is clocked into the frequency divider circuit 104 as defined in the divide by six frequency divider configuration instead of the "011" state as defined in the divide by five frequency divider configuration, see 416, after the state "110". While still in the divide by six frequency divider configuration, the next state of "011" is clocked into the frequency divider circuit 104. The next transition of the inverse of the feedback memory element output 108 causes the divide mode signal 102 to transition to its normally high state, see 414, provided the slip signal 112 has reverted to its normally low state prior to the inverse of the feedback memory element output 108 transition, see 420. Alternatively, the slip signal 112 can remain high for additional consecutive divide by 6 cycles. All remaining states of the divide by 5 and divide by 6 configurations are the same. Accordingly, an extra state is inserted into the frequency divider cycle thereby adjusting the phase of the frequency divider output 110 relative to the clock 106. All later frequency divider cycles 404 follow the divide by 5 pattern until the slip signal is initiated again to slip the cycle an additional cycle of the clock 106. As one of ordinary skill in the art appreciates, the slip process may be repeated until proper synchronization between the clock 106 and the frequency divider output 110 is detected. Once properly synchronized, the slip signal 112 and pulse generator 100 are no longer necessary unless the clock 106 and frequency divider output 110 require resynchronization.

Figure 5:
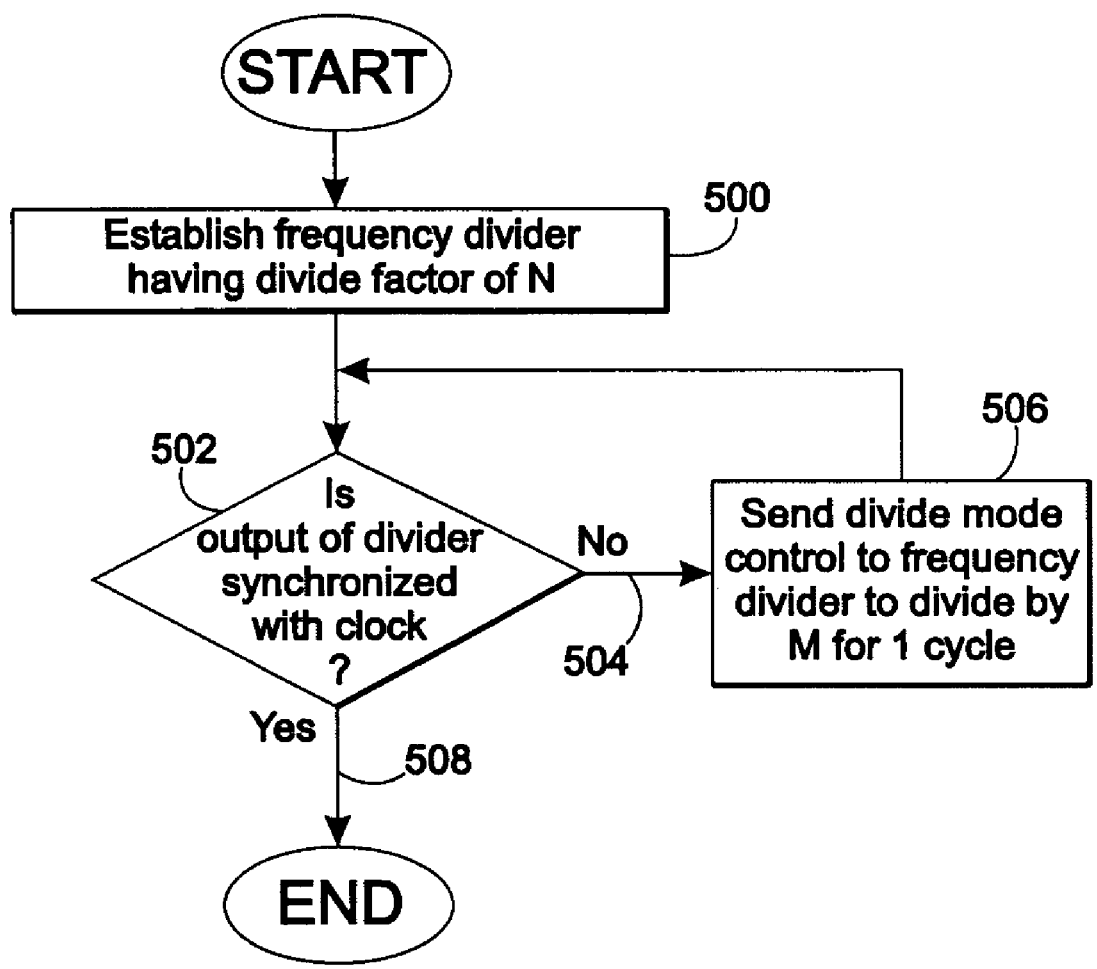
FIG. 5 is a flow chart of a method according to the present teachings.

With specific reference to FIG. 5 of the drawings, there is shown a flow chart of the repetitive process for synchronizing a specific repetitive edge 420 of the clock 106 with an edge of the frequency divider output 110. In a first step of the process, the frequency divider output 110 is established 500 as a stable multiple of the clock 106 having a divide factor of N. If the frequency divider output 110 is properly synchronized with the desired repetitive edge 420 of the clock 106, the process ends. If synchronization is not detected 504, the pulse generator 100 initiates a slip signal 112 to cause 506 the frequency divider 104 to divide by M for one cycle of the clock 106 where an absolute value of (N−1)=1. As an example, if the frequency divider 104 divides the clock 106 by 5, the slip signal 112 causes the frequency divider 104 to divide the clock 106 by 6 for a single cycle of the clock 106. After the slip cycle, therefore, the frequency divider output 110 is phase adjusted relative to the clock by a single clock cycle. If synchronization occurs, the process ends 508. If synchronization is not detected 504, a new slip signal is initiated to adjust the phase of the clock 106 relative to the frequency divider output 110 by another single cycle of the clock 106. As one of ordinary skill in the art appreciates, five slip cycles 506 result in an 360 degree shift of a specific repetitive edge 420 of the clock 106 relative to the frequency divider output 110. Accordingly, for a divide factor of N, no more than N−1 slip cycles are required in order to synchronize.

Figure 6:
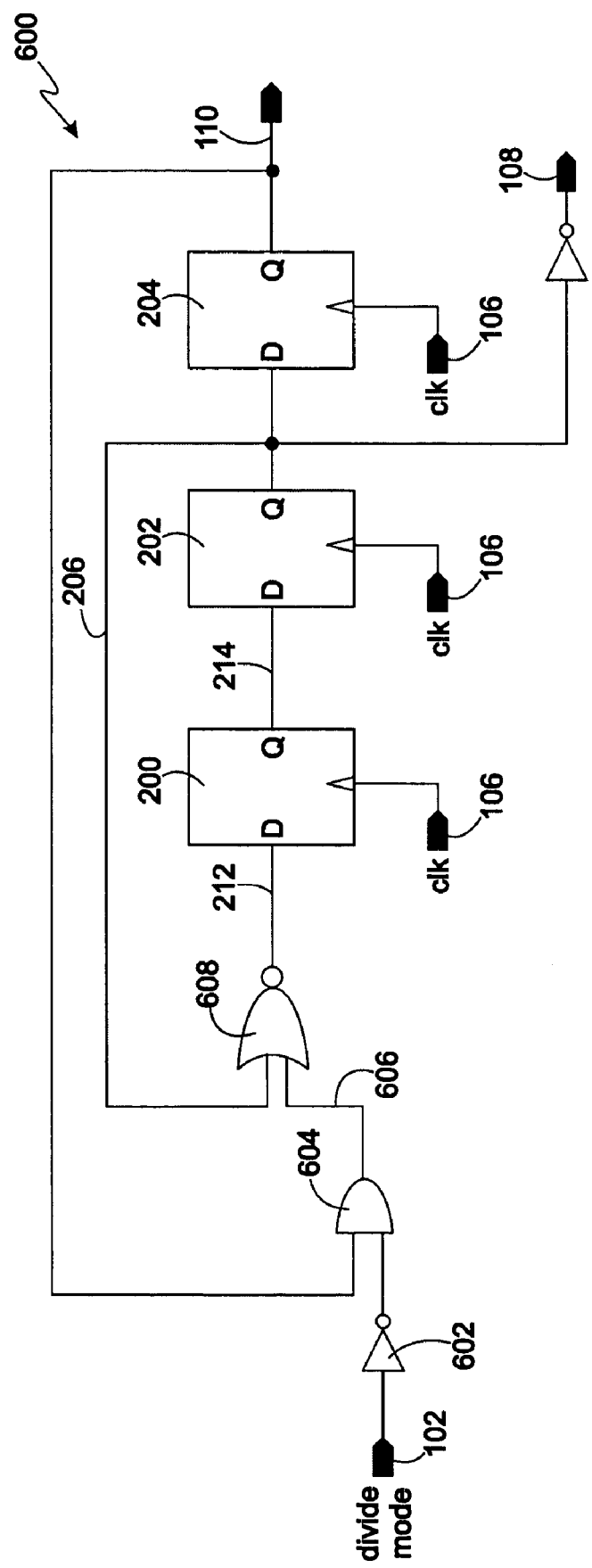
FIG. 6 is an alternate embodiment of a frequency divider according to the present teachings.

In another embodiment of a frequency divider with slip according to the present teachings, the frequency divider circuit 600 has a divide by N divide factor and the slip cycle is a divide by (N−1). In a specific example, the frequency divider 600 is a divide by 5/divide by 4. Accordingly, the phase shift of the frequency divider output 110 relative to the clock 106 occurs by shortening the period of the frequency divider by a single cycle of the clock 106 over a period of the frequency divider output 110 instead of lengthening the period by one cycle of the clock 106 as shown and described with respect to FIGS. 2 through 4. With specific reference to FIG. 6 of the drawings an alternative embodiment uses the same pulse generator circuit 100 shown in FIG. 3. The divide mode signal 102, however, is inverted at inverter element 602. The divide mode signal 102, therefore, is normally low and the slip cycle is initiated by a high going pulse instead of a low going pulse as in the circuit of FIG. 2. When the divide mode signal 102 is "low", the frequency divider 600 divides by 5. When the divide mode signal 102 is "high", it causes the frequency divider 600 to divide by 4 for a single frequency divider cycle. In FIG. 6, the frequency divider 600 comprises the re-circulating, feedback and end memory elements 200, 202 and 204, respectively. The end memory element output 110 is conjunctively combined at AND gate 604 with the inverse of the divide mode signal 102. Accordingly, when the divide mode signal is low, the inverse of the divide mode signal 102 is "high" and the end memory element output 110 affects an input to the re-circulating memory element 200. An output of the conjunctive combination of the inverse of the divide mode signal 102 and the end memory element output 110, AND gate output 606, is disjunctively combined with the feedback memory element output 206 and inverted at NOR gate 608. When the divide mode signal 102 is "high", it's inverse is "low" and removes the affect of the end memory element output 110 from the circuit.

With further reference to FIG. 6 of the drawings, when the divide mode signal 102 is "low", the input to the AND gate 604 is always a logic "1" and the end memory element output 110 is a factor in the frequency divider circuit 600 and the truth table for the frequency divider circuit 600 is as follows:

TABLE 3

| State # | Logic state |
| --- | --- |
| 1 | 100 |
| 2 | 110 |
| 3 | 011 |
| 4 | 001 |
| 5 | 000 |
| 6 | 100 |
| 7 | 110 |

Table 3 three shows only defined states of the frequency divider. As disclosed in the Self-Initializing Frequency Divider patent application referenced herein, undefined states eventually transition to one of the defined states for a stable and repeatable self-initializing frequency divider.

When the divide mode signal 102 is "high", the input to the AND gate 604 is always a logic "0" and the end memory element output 110 is not a factor in the frequency divider circuit 600 and the truth table for the frequency divider circuit 600 is as follows:

TABLE 4

| State # | Logic state |
| --- | --- |
| 1 | 100 |
| 2 | 110 |
| 3 | 011 |
| 4 | 001 |
| 5 | 100 |
| 6 | 110 |
| 7 | 011 |

As is apparent from a comparison of Tables 3 and 4, the circuit shown in FIG. 6 divides by 5 or divides by 4 depending upon a logic value of the divide mode signal 102. Specifically, the logic state "000" is a defined by state for the divide by 5 configuration and is not a defined state for the divide by four configuration. In this embodiment, an inverse of the divide mode signal 102 causes the frequency divider to skip the "000" logic state for one cycle of the frequency divider. At the end of the shorter frequency divider cycle, therefore, the phase of the end memory element output 110 of the divide by five frequency divider is shifted one clock cycle relative to the clock 106.

Figure 7:
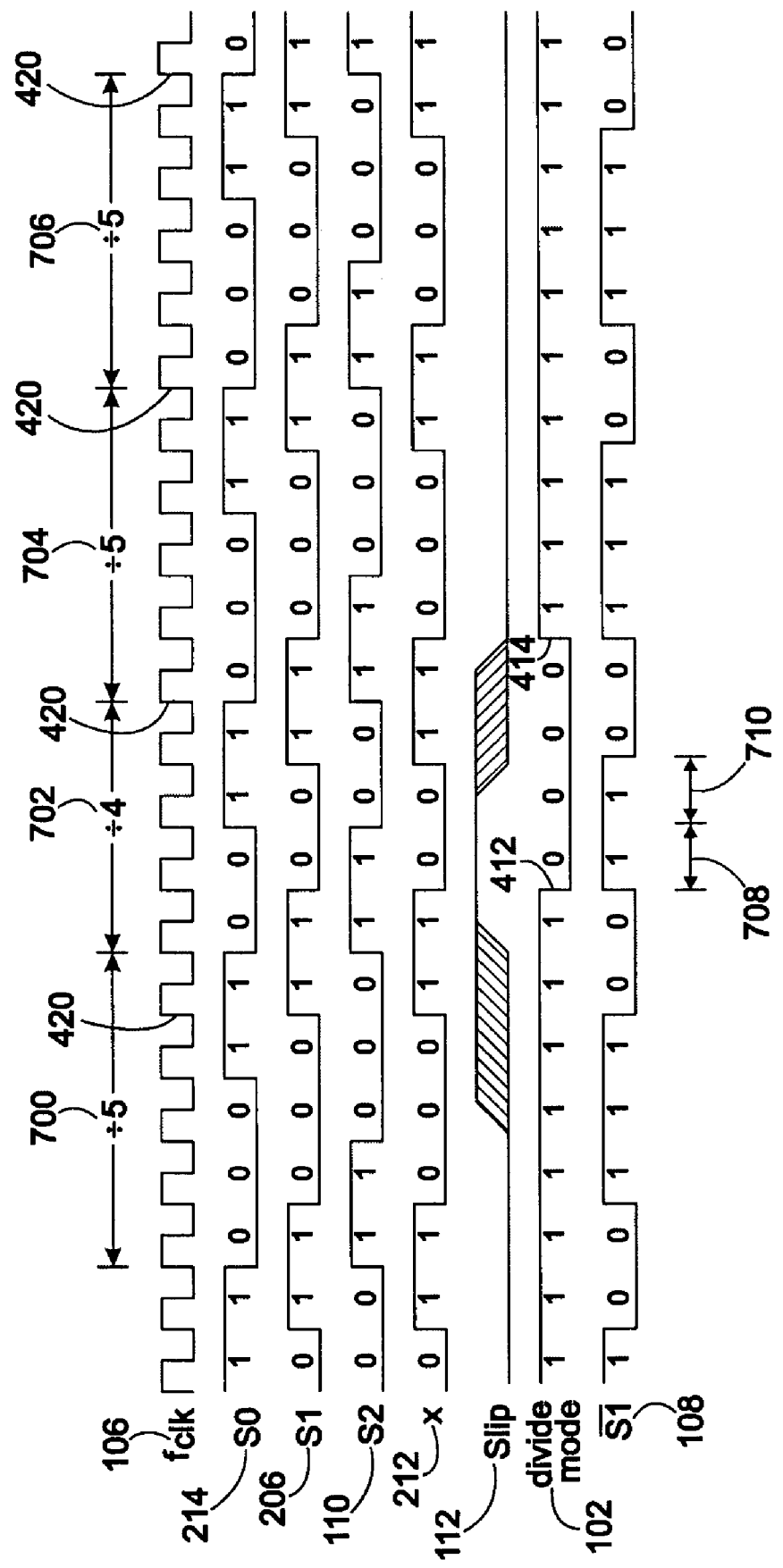
FIG. 7 is a timing diagram of the frequency divider of FIG. 6 responding to a divide mode signal from the pulse generator of FIG. 3.

With specific reference to FIG. 7 of the drawings, there is shown a timing diagram showing a relationship of logic edges relevant in the embodiment illustrated in FIG. 6 of the drawings. It is desired to synchronize a rising edge of the end memory element output 110 with a specific every $5^{th}$ edge of the clock, 420. During a previous divide by 5 cycle 700, the slip signal 112 is initiated with a low to high going pulse. The slip signal 112 may transition any time before the rising edge of the inverse of the feedback memory element output 108, which in a specific embodiment, drives the pulse generator 100. The transition of the slip signal 112 is realized by the pulse generator at the falling edge of the feedback memory element output 206 or the rising edge of the inverse of the feedback memory element 108 and causes the divide mode signal 102 to transition "high" to "low". In the embodiment of FIG. 6, the divide mode signal 102 is inverted prior to presentation to the frequency divider circuit 600. Accordingly, feedback from the end memory element output 110 is removed from the circuit when the divide mode signal 102 is normally "high". When the divide mode signal transitions to a "low" 412, the logic state of the frequency divider 600 is "001". The "001" logic state is defined for both the divide by five and divide by four configurations. See reference numeral 708. With the divide mode signal 102 "low", the AND gate 604 removes the feedback from the end memory element output 110. A next state after the "001" state is a "000" logic state in the divide by 5 configuration and a "100" in the divide by four configuration. Because the divide mode signal 102 is "low", the frequency divider 600 is in the divide by four configuration. Accordingly, the logic state realized by the frequency divider 600 after the "001" state 708 is logic state "100" 710 and not logic state "000". When the divide mode signal 102 is low, therefore, the frequency divider 600 skips over the "000" logic state and provides only four logic states in the cycle. The divide by four cycle is shown as 702. The slip signal 112 under the illustrated embodiment transitions back to a "low" logic state prior to the next rising edge of the inverted feedback memory element output 108 and the pulse generator 100 restores the divide mode signal 102 to its normally "high" output at 414. While the divide mode signal 102 is "high", the logic state "000" is defined and the frequency divider 600 resumes the repetitive divide by five operation shown as cycles 704 and 706. In the timing illustration of FIG. 7, the desired repetitive 5$^{th}$ edge of the clock 106, shown as 420, begins at one clock cycle in front of the rising edge of the end memory element output 110. After shortening one cycle of the frequency divider by one cycle of the clock 106, the repetitive 5$^{th}$ edge 420 is aligned with the end memory element output 110 for remaining cycles 704, 706 of the frequency divider 600.

Embodiments according to the present teachings are described by way of example to illustrate specific examples of that which are claimed. Other embodiments and adaptations will occur to one of ordinary skill in the art given the present teachings and are considered within the scope of the appended claims. Specifically, frequency dividers with divide factors other than divide by 5/divide by 6 and divide by 5/divide by four are within the scope of the present teachings and may be used when a specific every Nth edge of the clock 106 is to be synchronized with an edge of a divide by N frequency divider. Frequency divider configurations equivalent to that shown in FIGS. 2 and 6 of the drawings adapted according to DeMorgan's theorem are also within the scope of the present teachings.

The invention claimed is:

1. An apparatus comprising:
   a frequency divider accepting and dividing a clock, the frequency divider selectable between an N divide factor and an M divide factor via a divide mode signal, wherein an absolute value of(N−M)=1, and
   a pulse generator responsive to a slip signal and driven by a frequency divider output and providing the divide mode signal to the frequency divider, wherein the divide mode signal is a pulse have a duration equal to a single cycle of the output of the frequency divider.

2. An apparatus as recited in claim 1 wherein the frequency divider having the N divide factor is a self-initializing frequency divider.

3. An apparatus as recited in claim 1 wherein the frequency divider comprises a state machine having N states when the divide mode signal has a first value and the N states in addition to another state when the divide mode has a second value.

4. An apparatus as recited in claim 1 wherein the frequency divider comprises a state machine having N states when the divide mode signal has a first value and one state less than the N states when the divide mode has a second value.

5. An apparatus as recited in claim 1 wherein N=5 and M=6.

6. An apparatus as recited in claim 1 wherein N=5 and M4.

7. An apparatus as recited in claim 1 wherein the frequency divider comprises a re-circulating memory element, a feedback memory clement arid an end memory element in series combination wherein a feedback memory element output and an end memory element output are logically combined to provide an input to the re-circulating memory element.

8. An apparatus as recited in claim 7 wherein a logical combination of the divide mode signal and the feedback memory element output masks and unmasks an impact of the feedback memory element output on the frequency divider depending upon a status of the divide mode signal.

9. An apparatus as recited in claim 1 wherein the pulse generator comprises first and second flip flops responsive to the output of the frequency divider wherein first and second flip flop outputs are logically combined to generate the divide mode signal.

10. An apparatus comprising:
    a frequency divider configured to divide a clock signal by N or M depending upon a status of a divide mode signal, wherein the divide by N configuration is a self-initializing frequency divider and an absolute value of(N−M)=1, and wherein the divide mode signal is a pulse having a duration equal to a single cycle of the output of the frequency divider.

11. An apparatus as recited in claim 10 and further comprising a pulse generator responsive to a slip signal and driven by an output of the frequency divider that provides the divide mode signal to the frequency divider.

12. An apparatus as recited in claim 11 wherein the pulse generator comprises first and second flip flops responsive to the output of the frequency divider wherein first and second flip flop outputs are logically combined to generate the divide mode signal.

13. An apparatus as recited in claim 10 wherein the frequency divider comprises a state machine having N states when the divide mode signal has a first value and N states in addition to another state when the divide mode signal has a second value.

14. An apparatus as recited in claim 10 wherein the frequency divider comprises a state machine having N states when the divide mode signal has a first value and N states less one state when the divide mode signal has a second value.

15. An apparatus as recited in claim 10 wherein the frequency divider comprises a re-circulating memory element, a feedback memory element and an end memory element in series combination wherein a feedback memory element output and an end memory element output are logically combined to provide an input to the re-circulating memory element.

16. An apparatus as recited in claim 15 wherein a logical combination of the divide mode signal and the feedback memory element output masks and unmasks an impact of the feedback memory element output on the frequency divider depending upon a divide mode signal status.

17. An apparatus as recited in claim 10 wherein N=5 and M=6.

18. An apparatus as recited in claim 10 wherein N=5 and M=4.

19. A method for synchronizing a clock and an output of a frequency divider driven by the clock comprising the steps of:

establishing the output of the frequency divider as a stable multiple of the clock having a divide factor of N, the frequency divider being self-initializing when operating with the divide factor of N, determining if the output of the frequency divider is synchronized with a specific repetitive edge of the clock, initiating a slip signal, causing the frequency divider to divide by a factor of M, wherein an absolute value of (N−M)=1, and repeating the steps of determining, initiating and causing until the output of the frequency divider and clock are synchronized.

20. A method as recited in claim 19 wherein N is greater than M.

21. A method as recited in claim 19 wherein M is greater than N.

\* \* \* \* \*

UNITED STATES PATENT AND TRADEMARK OFFICE
CERTIFICATE OF CORRECTION

PATENT NO.         : 7,196,558 B2                               Page 1 of 1
APPLICATION NO.    : 11/076758
DATED              : March 27, 2007
INVENTOR(S)        : Robert Miller It is certified that error appears in the above-identified patent and that said Letters Patent is hereby corrected as shown below:

(Column 7 Line 59) In Claim 1, delete "of(N-M)" and insert -- of (N-M) --, therefor.

(Column 7 Line 63) In Claim 1, delete "have" and insert -- having --, therefor.

(Column 8 Line 14)(Approx.) In Claim 6, delete "M4." and insert -- M=4. --, therefor.

(Column 8 Line 17)(Approx.) In Claim 7, delete "clement arid" and insert -- element and --, therefor.

(Column 8 Line 38) In Claim 10, delete "of(N-M)" and insert -- of (N-M) --, therefor.

Signed and Sealed this

Sixteenth Day of December, 2008

JON W. DUDAS
*Director of the United States Patent and Trademark Office*